(12) United States Patent
Iwasaki et al.

(10) Patent No.: US 7,288,494 B2
(45) Date of Patent: Oct. 30, 2007

(54) ELECTRO-MAGNETIC WAVE SHIELD COVER

(75) Inventors: Atsuo Iwasaki, Kanagawa pref. (JP); Toshikazu Numaguchi, Fujimi (JP); Yoshihiko Takahashi, Kuki (JP)

(73) Assignee: 3M Innovative Properties Company, St. Paul, MN (US)

( * ) Notice: Subject to any disclaimer, the term of this patent is extended or adjusted under 35 U.S.C. 154(b) by 325 days.

(21) Appl. No.: 10/483,198

(22) PCT Filed: Jul. 11, 2002

(86) PCT No.: PCT/US02/22248

§ 371 (c)(1),
(2), (4) Date: Jan. 6, 2004

(87) PCT Pub. No.: WO2003/013208

PCT Pub. Date: Feb. 13, 2007

(65) Prior Publication Data

US 2004/0235381 A1 Nov. 25, 2004

(30) Foreign Application Priority Data

Jul. 27, 2001 (JP) ............................. 2001-228121

(51) Int. Cl.
*D02G 3/00* (2006.01)
*D02G 3/12* (2006.01)
*D03D 15/00* (2006.01)

(52) U.S. Cl. .................. 442/189; 139/425 R; 174/388; 174/392; 174/393; 428/364; 428/365; 442/2; 442/6; 442/190; 442/191; 442/197; 442/217

(58) Field of Classification Search .......... 57/210–242; 428/371, 377, 36.3, 364, 365; 87/9; 139/387 R, 139/425 R; 623/1.49, 1.53, 13.19; 138/123–127; 174/388, 392, 393; 442/2, 6, 189, 190, 191, 442/197, 217
See application file for complete search history.

(56) References Cited

U.S. PATENT DOCUMENTS 1,696,411 A 12/1928 Crofton
(Continued)

FOREIGN PATENT DOCUMENTS

CN 1192568 A 9/1998
(Continued)

OTHER PUBLICATIONS

"Helical", Merriam-Webster Online Dictionary, 2006.*
"Helix", Merriam-Webster Online Dictionary, 2006.*

*Primary Examiner*—Terrel Morris
*Assistant Examiner*—Jennifer A Chriss
(74) *Attorney, Agent, or Firm*—John A. Burtis

(57) ABSTRACT

An electro-magnetic wave shield cover having an array of first yarn members (10) formed by bundling (48) ends of polyester fibers around which a tin-plated copper metallic foil (12) is wound. The second yarn member (20) is formed by bundling 96 ends of polyester fibers. Doubled-yarn groups (10A, 10B, 10C, 10D) of the first yarn members running in the first direction (warp) from upper right to lower left and doubled-yarn groups (20A, 20B, 20C, 20D) of the second yarn members (20) running in the first direction (warp), and doubled-yarn groups (10a, 10b, 10c, 10d) of the first yarn members running in the second direction (weft) from upper left to lower right and doubled-yarn groups (20a, 20b, 20c, 20d) of the second yarn members running in the second (weft) direction are arranged so that the interlacing is made in such a manner that if the doubled-yarn group, running in the one direction is twice disposed beneath the doubled-yarn groups running in the other direction, then it is twice disposed above the latter.

7 Claims, 3 Drawing Sheets

U.S. PATENT DOCUMENTS

| | | | |
|---|---|---|---|
| 2,458,243 A * | 1/1949 | Biddle | 57/229 |
| 3,288,175 A * | 11/1966 | Valko | 139/425 R |
| 4,557,968 A | 12/1985 | Booz et al. | |
| 4,567,094 A * | 1/1986 | Levin | 442/5 |
| 4,567,917 A * | 2/1986 | Millard | 138/126 |
| 4,684,762 A * | 8/1987 | Gladfelter | 174/36 |
| 5,386,345 A * | 1/1995 | Matsuzaki et al. | 361/816 |
| 5,712,010 A * | 1/1998 | Russek et al. | 428/36.3 |
| 6,787,491 B2 * | 9/2004 | Braekevelt | 442/212 |

FOREIGN PATENT DOCUMENTS

| | | |
|---|---|---|
| JP | 6-11599 | 3/1994 |
| JP | 10280208 A * | 10/1998 |

* cited by examiner

ELECTRO-MAGNETIC WAVE SHIELD COVER

DETAILED DESCRIPTION OF THE INVENTION

1. Technical Field to which the Invention Belongs

The present invention relates to an electromagnetic wave shield cover for shielding a body from electromagnetic waves output from another body, or preventing electromagnetic waves from leaving a certain body.

2. Description of the Prior Art

Various electromagnetic wave shield covers have been developed and used for shielding a body from electromagnetic wave output from another body, or preventing electromagnetic waves from leaving a certain body.

For example, a sheath type electromagnetic shield cover for covering an electric wire is disclosed in Japanese Examined Utility Model Publication No. 6-11599, wherein yarn members, around which a metal foil is wound, are interlaced with each other to form a round braid. This cover has a good shielding ability because the yarn members forming the braid are all wrapped with the metal foil, however it has high weight and poor elasticity and, therefore, the work to cover the electric wire, or others, to be shielded involves some difficulties.

Also, there is a braid made of a bundled glass fiber and a single metal wire. This is light in weight but the metal wire is liable to break when repeatedly bent or to become thin to increase the electric resistance.

An object of the present invention is to solve the above-mentioned problem by providing an electromagnetic wave shield cover light in weight, excellent in elasticity and favorable in durability.

SUMMARY OF THE INVENTION

According to the invention, an electromagnetic wave shield cover is provided which comprises an array of first yarn members each having the form of a bundle made by bundling fine fibers around which a metal foil is spirally wound, and second yarn members each being formed as a bundle made by bundling fine fibers, said first yarn members and said second yarn members are arranged at a predetermined order in a first direction, and an array of first yarn members each having the form of a bundle made by bundling fine fibers around which a metal foil is spirally wound, and second yarn members each having the form of a bundle made by bundling fine fibers, said first yarn members and said second yarn members being arranged in a predetermined order in a second direction angled to the first direction, wherein said first yarn members and said second yarn members in the two arrays are interlaced so as to make a fabric.

According to the electromagnetic wave shield cover thus structured, the first yarn members formed as a bundle of fine fibers around which a metal foil is wound, and the second yarn members formed as a bundle of fine fibers, are arranged in a predetermined order in one direction to define an array, and other first yarn members formed as a bundle fine fibers around which a metal foil is wound, and the other second yarn members formed as a bundle of fine fibers, are arranged in a predetermined order in the other direction angled to the one direction to define a second array, wherein each of the yarn members in the array interlaces each of the yarn members in another array in accordance with a predetermined rule to form a fabric.

According to one aspect of the invention, the electromagnetic wave shield cover above, is provided, wherein the metallic foil is spirally wound without overlapping.

(B) An illustration of a double-yarn group of second yarn members after being doubled.

Figure 4:
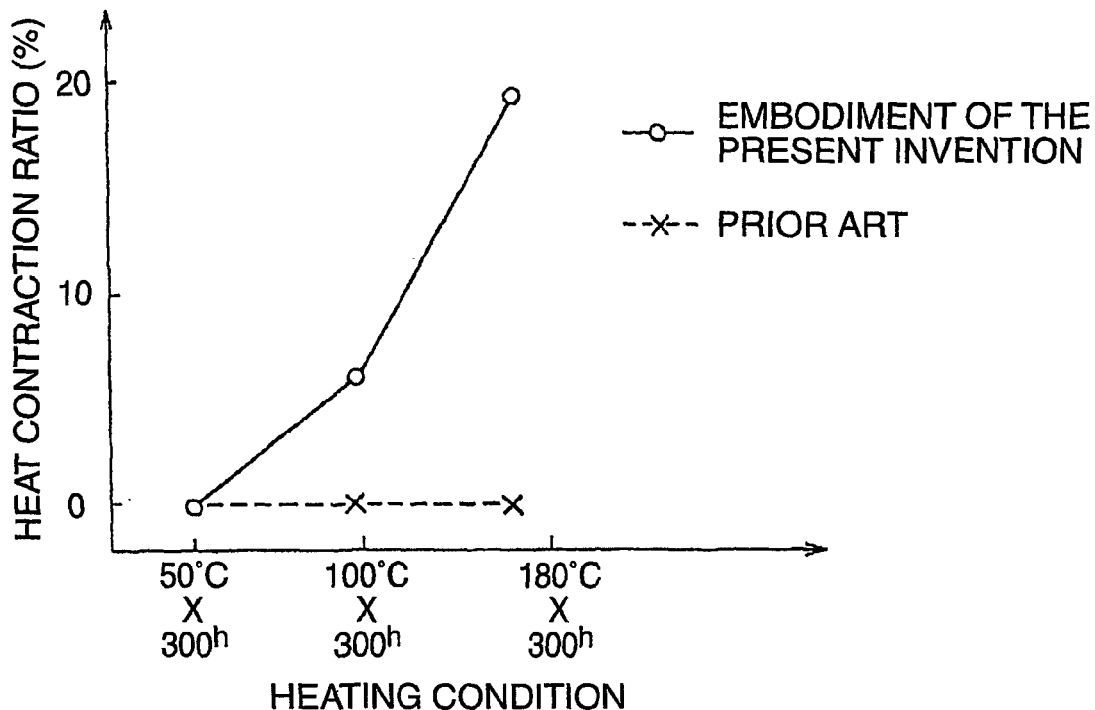

FIG. 4 A graph of the thermal shrinkage of the embodiment according to the present invention.

Figure 5:
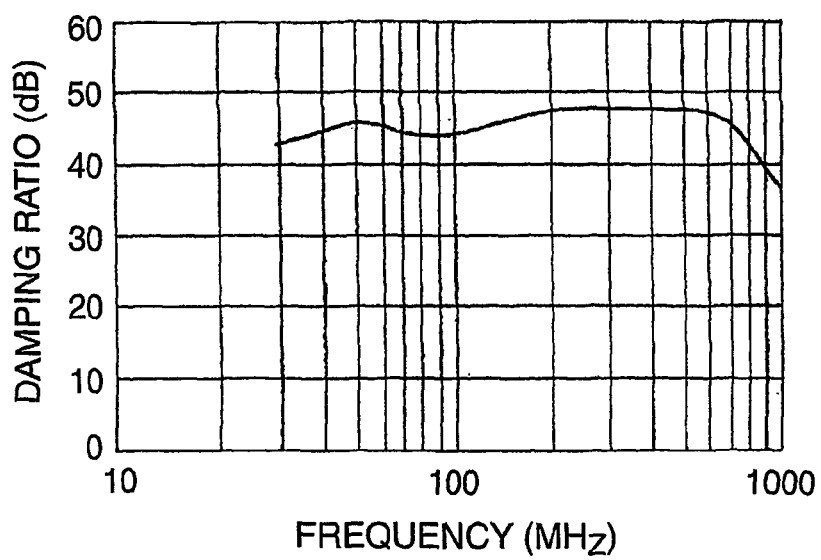

FIG. 5 A graph of the electromagnetic shielding characteristic of the embodiment according to the present invention.

EXPLANATION OF REFERENCE NUMERALS

10—first yarn member
11—synthetic fiber
12—metallic foil
20—second yarn member

DETAILED DESCRIPTION OF THE INVENTION

The present invention will be described in more detail below with reference to the drawings illustrating the preferred embodiments.

This embodiment has an array of a first yarn members 10, each formed by winding a metal foil 12 around a bundle 11 made by bundling fine fibers metal foil 12, and second yarn members 20, each formed by bundling fine synthetic fibers, both the yarn members being arranged in a predetermined order in a first direction, and a second array which has the same yarn members arranged in a predetermined order in a second direction angled to the first direction and the yarn members of the two arrays are interlaced in accordance with a predetermined rule so as to make a fabric, particularly a braid.

While polyester synthetic fiber is used in this embodiment, other synthetic fibers such as Tetron™, nylon or others may be used. When a high thermal durability is required, another synthetic fiber such as Comex fiber, PPS fiber or FR polymer fiber may be used. Also, natural fibers such as cotton, silk or wool may be used when clothing such as a magnetism-shielding cap or the like is produced.

Each of the synthetic fibers has a fiber size in a range from 1 to 10 decitex (dtex), preferably from 5 to 6 dtex. A bundle is formed by bundling 10 to 150 ends of such a fiber. In this embodiment, 48 ends of thin polyester fiber are bundled to have a yarn size of 280 dtex and an outer diameter of approximately 0.25 mm.

The synthetic fiber may be used as a single fiber, but preferably a bundle of a plurality of thin fibers is used to obtain elasticity. In this regard, if the yarn is twisted, the strength thereof may increase but there may be a risk in that the direction of spiral generated by the twist does not match with that of the metal foil to be wound around the yarn described later to cause instability in the metal foil.

On the other hand, a tin-plated copper foil is used as a metallic foil 12 to be wound around the strand 12 in this embodiment. The metallic foil has a thickness in a range from 10 to 60 µm, preferably of 30 µm, and a width in a range from 0.1 to 1 mm, preferably of 0.3 mm.

When the tin-plated copper foil 12 is spirally wound around the bundle 11, overlapping is avoided to keep a gap between every adjacent spiral. Preferably, the gap is as small as possible unless the adjacent edges of spirals of the metallic foil overlap. By winding the metal foil with a gap between the adjacent spirals, the resultant cover becomes more flexible and lighter in weight in comparison with that obtained without gap. Doubled first yarn members are interlaced to form a braid.

In this embodiment, the second yarn member is made by bundling a plurality of fine polyester fibers which are the same as those used in the first yarn member, except that the number of the polyester fibers is 96, twice that of the first yarn member to result in the yarn size of 560 dtex. A doubled second yarn member is interlaced to form a braid.

In the same manner as the first yarn member, synthetic fibers other than polyester, such as Tetron or nylon may be used. When a higher thermal durability is required, Comex fiber, PPS fiber or FR polymer fiber may be used. Also, natural fiber such as cotton, silk or wool may be used.

Next, a description will given of a braid formed of the first yarn member 10 and the second yarn member 20.

Figure 1:
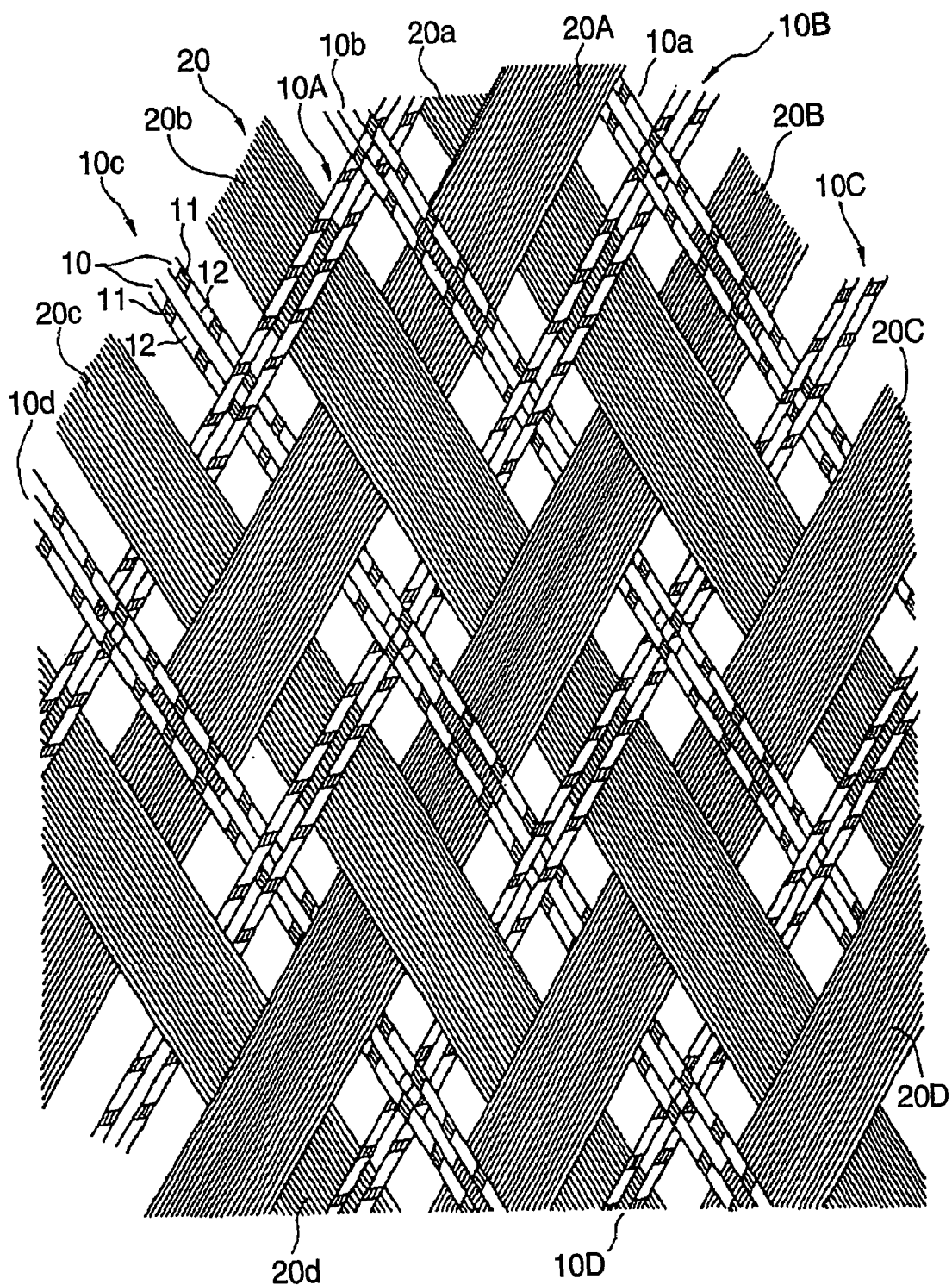
FIG. 1 An enlarged view of a surface of one embodiment of the present invention.
Figure 2:
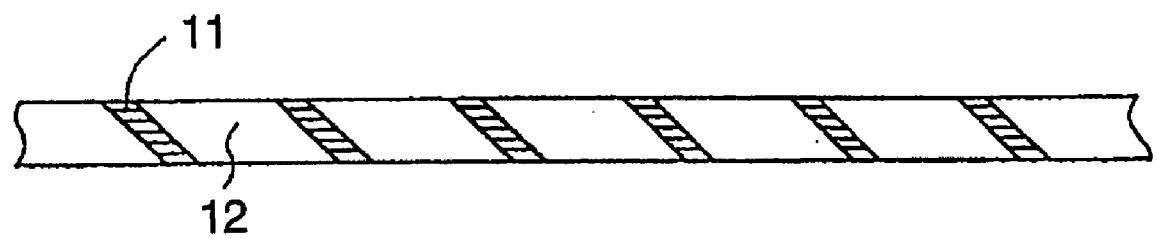
FIG. 2 An enlarged view of a first yarn member.

As shown in FIG. 1, a double-yarn group of the first yarn members 10 and the second yarn members 20 disposed in a side-by-side manner, respectively, are arranged in a first direction running from upper right to lower left and a second direction running from upper left to lower right while crossing each other.

The doubled-yarn group of the first yarn members 10 disposed in a side-by-side manner and running in the first direction is sequentially referred to from above as 10A, 10B, 10C and 10D, respectively; and the doubled-yarn group of the second yarn members 20 disposed in a side-by-side manner and running in the first direction is sequentially referred to from above as 20A, 20B, 20C and 20D, respectively. The doubled-yarn group of the first yarn members 10 disposed in a side-by-side manner and running in the second direction is sequentially referred to from above as 10a, 10b, 10c and 10d, respectively; and the doubled-yarn group of the second yarn members 20 disposed in a side-by-side manner and running in the second direction is sequentially referred to from above as 20a, 20b, 20c and 20d, respectively.

As illustrated, the doubled-yarn group 20A, 20B, 20C or 20D of the second yarn members 20 running in the first direction and the doubled-yarn group 20a, 20b, 20c or 20d of the second yarn members 20 running in the second direction has a single oval cross-section formed from originally separated two circular cross-sections of the second yarn members which are collapsed and intermingled together.

Figure 3A:
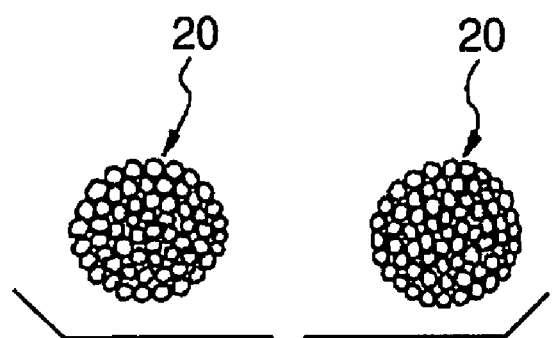
FIG. 3 (A) An illustration of a double-yarn group of second yarn members prior to being doubled.
Figure 3B:
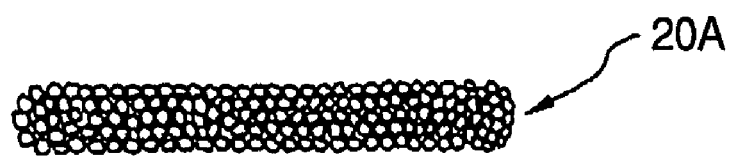

FIG. 3A shows cross-sections of the second yarn members 20 before being doubled, and FIG. 3B shows a cross-section of the second yarn members 20 after being doubled.

The doubled-yarn group 10A of the first yarn member 10 running in the first direction crosses the doubled-yarn groups 10b, 10c and 10d of the first yarn members 10 running in the second direction and the doubled-yarn groups 20b, 20c and 20d of the second yarn members 20 running in the second direction.

The doubled-yarn group 10b of the first yarn members 10 is arranged above the doubled-yarn group 10A of the first yarn members 10 running in the first direction; the doubled-yarn group 20b of the second yarn members 20 adjacent to the doubled-yarn group 10b of the first yarn members 10 is arranged beneath the doubled-yarn group 10A of the first yarn members 10 running in the first direction; the doubled-yarn group 10c of the first yarn members 10 adjacent to the doubled-yarn group 20b of the second yarn members 20 is arranged beneath the doubled-yarn group 10A of the first yarn members 10 running in the first direction; the doubled-yarn group 20c of the second yarn members 20 adjacent to the doubled-yarn group 10c of the first yarn members 10 is arranged above the doubled-yarn group 10A of the first yarn members 10 running in the first direction; and the doubled-yarn group 10d of the first yarn members 10 adjacent to the doubled-yarn group 20c of the second yarn members 20 is arranged above the double-yarn group 10A of the first yarn members 10 running in the first direction. That is, the interlacing is made such that if the double-yarn group running in the first direction is twice disposed above the double-yarn groups running in the second direction, then it is twice disposed beneath the latter. This is also true to the other doubled-yarn groups 10B, 10C and 10D of the first yarn members 10 running in the first direction.

A round braid having an inner diameter of 14 mm is formed by means of a round braiding machine-with 48 feeders. The braid is of a so-called sleeve shape. While this braid has an inner diameter of 14 mm on the braiding machine, it has good elasticity and is stretchable in the longitudinal direction to become smaller in diameter. Contrarily, if contracted in the longitudinal direction, it can have a larger diameter. The smallest outer diameter is 3.8 mm and the largest inner diameter is 23.5 mm. Accordingly, it is applicable to various bodies to be shielded from electromagnetic waves, such as an electric wire.

When putting the braid on the electric wire, the inner diameter of the braid is initially widened and then contracted so that the braid is in tight contact therewith, and the work is improved.

By using the first yarn member of synthetic fibers around which a metal foil is wound and the second yarn member solely formed of synthetic fibers, the weight becomes less than the prior art product described in Japanese Examined Utility Model Publication No. 6-11599 and is about one fourth thereof.

The above-mentioned prior art product hardly shrinks when heat is applied. Contrarily, in this embodiment, the braid has a thermal shrinkage of at least several percentage. Accordingly, it is possible to heat-treat the same after putting it on the body to be shielded so that a tight contact is obtainable.

FIG. 4 shows a graph of the thermal shrinkage in which the horizontal axis represents a heat treatment condition and the vertical axis represents the thermal shrinkage. A curve connecting white circles shows the present invention, and a curve connecting crosses shows the prior art. As is apparent from this graph, while the prior art product hardly shrinks, the inventive product shrinks 6% when heated to 100° C. for 300 hours.

As a number of synthetic fibers are exposed on the cut surface if the braid is cut, it is possible to prevent the synthetic fibers from fraying by heating and fusion-bonding the synthetic fibers.

In this embodiment, the shield cover is made into a braid, however it can also be made as a woven fabric or a knit fabric. For example, in place of synthetic fiber, natural fiber such as cotton may be used and woven into a fabric from which clothing, a cap or an umbrella having an electromagnetic shielding ability may be obtained.

FIG. 5 shows the electromagnetic shielding characteristic curve of this embodiment, wherein the damping effect (shieldability) is 40 dB or more in a range from 30 to 500 MHz, and 30 dB or more in a range from 500 to 1000 MHz.

It is possible to obtain the required electromagnetic shielding level by adjusting a ratio of the first yarn member 10 and the second yarn member 20 or adjusting the distance between the doubled first yarn members 10.

The invention defined by each of the claims is an electromagnetic wave shield cover and comprises an array of first yarn members each having the form of a bundle made by bundling fine fibers around which a metal foil is spirally wound, and second yarn members each formed as a bundle made by bundling fine fibers, said first yarn members and said second yarn members are arranged at a predetermined order in a first direction; and a second array of first yarn members each having the form of a bundle made by bundling fine fibers around which a metal foil is spirally wound, and second yarn members each having the form of a bundle made by bundling fine fibers, said first yarn members and said second yarn members are arranged at a predetermined order in a second direction angled to the first direction, wherein said first yarn members and said second yarn members in the two arrays are interlaced so as to make a fabric.

The inventive cover is not formed solely of yarn members around which a metal foil is wound, but uses first yarn members having a form of a bundle made by bundling fine fibers around which a metal foil is wound and second yarn members having a form of bundle made by bundling fine fibers. Thus, the inventive cover is light in weight and excellent in stretchability as well as durability.

What is claimed is:

1. A woven fabric comprising:
    a first array of yarns in a first direction comprising at least two adjacent first yarn members alternating with at least one second yarn member, each first yarn member comprising a bundle of fine synthetic fibers which is spirally wound with a metal foil, each second yarn member comprising a bundle of fine synthetic fibers not spirally wound with a metal foil; and
    a second array of yarns in a second direction at an angle to the first direction comprising at least two adjacent first yarn members alternating with at least one second yarn member, each first yarn member comprising a bundle of synthetic fibers which is spirally wound with a metal foil, each second yarn member comprising a bundle of fine synthetic fibers not spirally wound with a metal foil,
    wherein the first array of yarns and the second array of yarns are interlaced.

2. A woven fabric as defined by claim 1, wherein the metal foil is spirally wound without overlapping.

3. A woven fabric as defined by claim 1, wherein fibers of the first yarn members and the second yarn members are made of the same material with same diameter, and the first yarn member and the second yarn member have different numbers of fibers to be bundled.

4. A woven fabric comprising:
    a first array of yarns in a first direction comprising doubled first yarn members alternating with at least one second yarn member, each first yarn member comprising a bundle of fine synthetic fibers which is spirally wound with a metal foil, each second yarn member comprising a bundle of fine synthetic fibers not spirally wound with a metal foil; and
    a second array of yarns in a second direction at an angle to the first direction comprising doubled first yarn members alternating with at least one second yarn member, each first yarn member comprising a bundle of synthetic fibers which is spirally wound with a metal foil, each second yarn member comprising a bundle of fine synthetic fibers not spirally wound with a metal foil,
    wherein the first array of yarns and the second array of yarns are interlaced.

5. A woven fabric as defined by claim 4, wherein the second yarn member is doubled.

6. A woven fabric as defined by claim 4, wherein one or both of the first yarn members and second yarn members comprises polymeric synthetic fibers.

7. A woven fabric as defined by claim 1, wherein one or both of the first yarn members and second yarn members comprises polymeric synthetic fibers.

* * * * *